FLAT PACKAGE ENCAPSULATION OF ELECTRICAL DEVICES

Filed June 3, 1966

WITNESSES:

Bernard R. Giegucz

Donald M. Winegar

INVENTORS
Thomas P. Nowalk and
Herbert E. Ferree.

BY

C. L. Menzemer

ATTORNEY 3,437,887

FLAT PACKAGE ENCAPSULATION OF ELECTRICAL DEVICES

Thomas P. Nowalk and Herbert E. Ferree, Hempfield, Greensburg County, Pa., assignors to Westinghouse Electric Corporation, Pittsburgh, Pa., a corporation of Pennsylvania Filed June 3, 1966, Ser. No. 555,136
Int. Cl. H01l 5/02
U.S. Cl. 317—234 8 Claims

ABSTRACT OF THE DISCLOSURE

A flat package electrical device comprises a body of semiconductor material having at least three regions of semiconductivity disposed between two electrically and thermally conductive metal membranes which form opposed major surfaces of the device. Each of the membranes forms an electrical contact to one of the regions of semiconductivity. An electrical contact is affixed to the third region of the body of semiconductivity and has an electrically conductive tab extending outwardly from the body between the two opposed membranes. The body of semiconductor material is hermetically sealed within the electrical device by embedding the outer peripheral edges of the membranes in a plastic material, cooperating with a pair of resilient O-ring members each of which is disposed between one of the membranes and the electrical contact to the third region of the body of semiconductor material.

This invention relates to a new and improved method of making electrical contact to a hermetically sealed body of semiconductor material.

An object of this invention is to provide an improved hermetically sealed flat package for a semiconductor element having at least three regions of conductivity and providing an electrical connecting means to each region of conductivity.

Another object of this invention is to provide an electrical contact to a hermetically sealed semiconductor element in which the contact is also a component of the hermetic sealing means.

Other objects of the invention will in part be obvious and will, in part, appear hereinafter.

In order to more fully understand the nature and objects of this invention, reference should be had to the following detailed description and drawings in which.

In accordance with the present invention and in attainment of the foregoing objects, there is provided an electrical device comprising (1) a first electrically and thermally conductive membrane, (2) a second electrically and thermally conductive membrane, (3) a semiconductor element having at least three regions of semiconductivity disposed between the two membranes, one region of semiconductivity being in an electrical and thermal conductive relationship with the first membrane and a second region of semiconductivity being in an electrical and thermal conductive relationship with the second membrane, (4) an electrical contact means disposed between the two membranes and connected to at least a portion of a third region of conductivity of the element, (5) hermetic sealing means cooperating with the two membranes and the electrical contact means to hermetically seal the semiconductor element within the device, and (6) means for connecting the electrical contact means into an electrical circuit external to the device.

Figure 1:
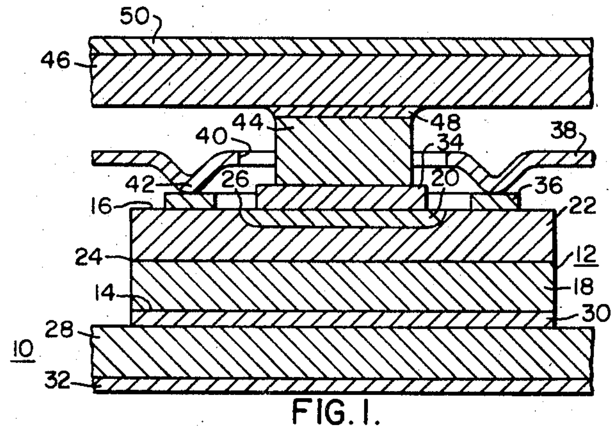
FIGURE 1 is a view, partly in cross-section, of a portion of an electrical device made in accordance with the teachings of this invention.

With reference to FIG. 1 there is shown a portion 10 of an electrical device made in accordance with the teachings of this invention.

The portion 10 comprises a semiconductor element 12 having two major opposed surfaces 14 and 16, at least two regions 18 and 20 of a first type semiconductivity and a third region 22 of a second type semiconductivity, and a first semiconductor transition region 24 formed at the interface between region 18 and region 22 and a second semiconductor transition region 26 formed at the interface between region 20 and region 22.

The semiconductor element 12 is disposed on, and affixed to, a first electrically and thermally conductive contact 28 by suitable means known to those skilled in the art, such for example, as by a layer 30 of a suitable semiconductor solder material.

The electrical contact 28 is, in turn, disposed on, and in an electrical and thermal conductivity relationship with a first malleable metal membrane 32.

A second electrical contact 34 is disposed on the surface 16 of the element 12 and in electrical contact with the region 20 of first type semiconductivity. A third electrical contact 36 is also disposed on the surface 16 of the element 12 and in electrical contact with the region 22 of second type semiconductivity.

An embossed electrical contact washer 38, having an aperture 40 passing entirely therethrough, is disposed on, and in electrical contact with the contact 36 of the element 12. Preferably, an embossment 42 of the contact washer 38 is ultrasonically welded or solid state bonded to the contact 36.

A fourth electrical contact 44, is disposed on, and is in electrical contact with the second electrical contact 34 disposed on the element 12. The contact 44 etxends upwardly through the aperture 40 of the contact 38 and is electrically connected to a fifth electrical contact 46. The contact 44 may be joined electrically to the contact 46 by such suitable means as a layer 48 of electrical solder material.

The contact 46 is an electrical and thermal conductivity relationship with a second malleable metal membrane 50.

The membranes 32 and 50 and the embossed electrical contact 38 are features of an electrical package which hermetically seals the element 12 within the package. The membranes 32 and 50 and the contact 38 provide the necessary electrical connections between electrical circuits external to the package and the hermetically sealed semiconductor element 12.

The feature of two electrically conductive membranes cooperating with an electrical contact to provide electrical connections to, while cooperating to provide hermetically sealing means for, a semiconductor element is preferably employed with a semiconductor element functioning as a thyristor.

Figure 2:
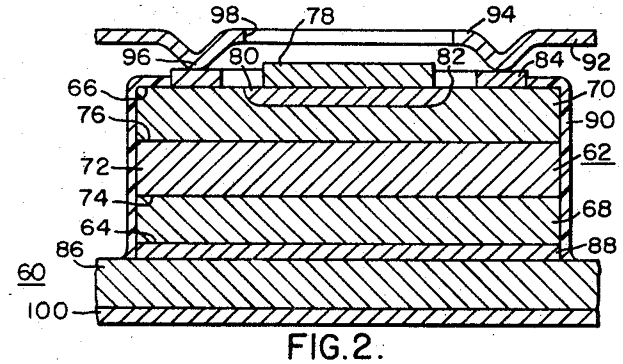
FIG. 2 is a view, partly in cross-section of a portion of a preferred electrical device made in accordance with the teachings of this invention.

With reference to FIG. 2 there is shown a portion 60 of a preferred electrical device embodying the teachings of this invention.

The portion 60 of the electrical device comprises a semiconductor element 62 having two major opposed surfaces 64 and 66. The semiconductor element 62 comprises a body of semiconductor material selected from the group consisting of silicon, silicon carbide, germanium, compounds of Group III and Group V elements and compounds of Group II and Group VI elements.

In order to more easily describe the novel features of this invention, and for no other reason, the element 62 will be described as comprising a body of N-type silicon and being circular in shape.

The element 62 of the N-type semiconductivity silicon is suitably doped with a P-type dopant to create a first region 68 of P-type semiconductivity and a second region 70 of P-type semiconductivity. The initial body of silicon semiconductor material forms a third region 72 of N-type semiconductivity. A first semiconductor transition region 74 is formed at the interface between the region 68 and the region 72. A second semiconductor transition region 76 is found at the interface between the region 70 and the region 72.

A first electrical contact 78, circular in shape, is centrally disposed on the surface 66 of the element 62. The contact 78 consists of a suitable electrically conductive metal, such, for example as an alloy of gold and a metal from the elements comprising Group V of the Periodic Table. The alloy of gold and a Group V element, upon melting and recrystallization forms a region 80 of an N-type alloy junction in the adjoining region of the surface 66 of the element 62 to which it is attached and a semiconductor transition region 82 is formed at the interface between regions 70 and 80. An electrical semiconductive relationship, or a rectifying junction, between the element 62 and the contact 78 is thereby obtained. An alloy of gold-antimony is a preferred material for forming the contact 78.

A second electrical contact 84, annular in shape and having good electrical conductivity, is disposed about, and on the same surface 66 of the element 62, as the contact 78. The contact 84 need not be continuous. Like the contact 78, the contact 84 should be in a good electrically conductive nonrectifying relationship with the region 70 of the element 62 to which it is affixed. The material comprising the contact 84 preferably includes a member of the Group III elements or class of metals such, for example, as gold-boron, aluminum and the like, thereby forming a nonrectifying contact with the P-type conductivity silicon of the region 70. Employing a metal of this class assures one that a good physical and ohmic electrical bond will be attained between the contact 84 and the region 70 of the element 62.

The semiconductor element 62 is disposed on, and affixed to, a third electrical contact 86 by suitable means known to those skilled in the art, such for example, as by a layer 88 of a suitable semiconductor solder material.

The contact 86 is a firm supporting structural member and functions as an electrical contact for the semiconductor element 62. The contact 86 comprises a metal such, for example, as molybdenum, tungsten, tantalum and combinations and base alloys thereof. The material comprising the contact 86 has very similar thermal expansion characteristics as the material comprising the semiconductor element 62.

To reduce the effects of moisture and chemical contamination on the semiconductor element 62, a layer 90 of a suitable protective coating material, such, for example, as silicone polymers, is applied to peripheral areas of the element 62. The material is particularly disposed on those peripheral areas of the element 62 where semiconductor transition regions, or P-N junctions, are exposed. Except for portions of the contact 84 and the contact 86 immediately adjacent to the areas accidentally coated by the material comprising the layer 90, care is taken to assure one that no essential electrical contact surface areas of the contacts 84 and 86 as well as the contact 78 are accidentally covered by the material comprising the layer 90.

An embossed electrical contact washer 92 is disposed on the contact 84. The washer 92 comprises a thermally and electrically conductive metal selected from the group consisting of silver, copper, aluminum, and tin with silver being the preferred metal. Basically, the contact washer 92 is circular in shape having a centrally disposed boss 94, an annular downwardly projecting ridge 96, concentric with the boss 94, and the boss 94 has a centrally disposed aperture 98.

The contact washer 92 is preferably affixed to the contact 84 by suitable means such, for example, as solid state bonding or by employing ultrasonic welding. Solid state bonding is a preferred means.

The process of forming the solid state bond is primarily dependent upon time, temperature and pressure which when properly correlated produce, through diffusion, coalescence of the base materials being bonded.

In pressure bonding the preferred silver electrical contact washer 92 to the preferred gold alloy gate contact 84, care must be exercised to prevent physical damage to the element 62 as well as impairment of the electrical properties of the body of semiconductor material. To achieve the required pressure bonding, a process requiring a heavy pressure in conjunction with a low temperature and applied for a moderately long time is required.

The semiconductor element 62 is placed in a self-aligning cup. The contact washer 92 is then disposed on the element 62 within the cup in such a manner that the ridge 96 coincides with and is in physical contact with the contact 84.

A force between 35 and 300 pounds per linear inch of bond length is then applied to the contact washer 92 and held constant. The components, still under the applied force, are then placed in a furnace. The furnace need not have any controlled atmosphere. The components are retained in the furnace for a period of time ranging from 0.5 to 5 hours at a furnace temperature of from 100 to 300° C. bonding the assembled components together. A force of 145 pounds per linear inch of bond length applied for three hours at a temperature of 250° C. ±10° C. has been found quite satisfactory for joining the silver contact washer 92 to the contact 84.

The resulting solid state bond is capable of withstanding severe thermal shocks and temperature cycling. No notable distortion of the electrical characteristics of the element 62 or the bond is noted, even when units are immediately plunged into liquid nitrogen from the furnace and then tested at room temperature. The physical bond between the washer 92 and the contact 84 is also very good. Attempts to fracture the bond results many times in the removal of portions of the body of semiconductor material as well. The ridge 96 is usually severely distorted before any fracturing occurs in the bond. The ridge 96 usually undergoes plastic deformation during bonding thereby increasing the surface area of the ridge 96 and enhancing the pressure bonding between the ridge 96 and the contact 84.

The element 62 affixed to the contact 86 and having the contact washer 92 bonded thereto is disposed on a portion of a metal membrane 100.

The membrane 100 is a malleable, nonmagnetic noble material. The membrane 100 has good thermal and electrical conductivity properties. The membrane 100 comprises a metal selected from the group consisting of tin plated copper, silver, aluminum, tin and base alloys thereof.

Figure 3:
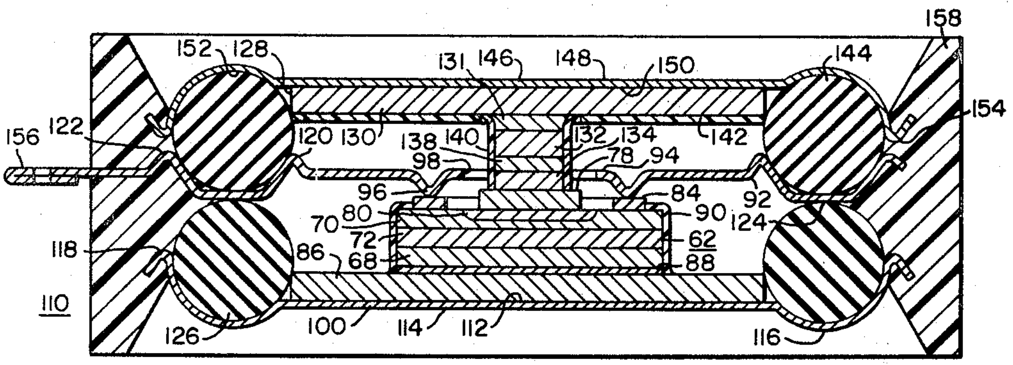
FIG. 3 is a view, partly in cross-section, of an electrical device embodying the portion shown in FIG. 2 and made in accordance with the teachings of this invention.

With reference to FIG. 3, there is shown an electrical device 110 embodying the portion 60 of a preferred electrical device shown in FIG. 2.

The membrane 100, employed to support the contact 86 to which is attached the element 62 and the contact washer 92 bonded to a portion of the element 62, is one of two identical membranes which comprise a portion of means for hermetically sealing the device 110. The portion of the membrane 100 utilized is an upper surface 112 of a raised boss 114. The surface 112 coincides with the mating surface of the contact 86. An annular trough 116 encompasses the boss 114. A raised projection 118 encompasses the trough 116 and extends above the surface 112.

The contact washer 92 in addition to its previously described features comprises upwardly projecting annular ridges 120 and 122, each of the ridges 120 and 122 being concentric with the ridge 96 and with each other. The ridges 120 and 122 form a trough 124 between them.

A first soft, pliable annular gasket 126 is disposed in the trough 116. The inner periphery of the gasket 126 conforms to the outer periphery of the contact 86 and centers the contact 86 on the upper surface 112 of the membrane 100.

The gasket 126 must be capable of retaining its resiliency properties at any high temperature operating conditions which the device 110 may have to function within without evolving any gases and must also be made of an electrically nonconducting material. A suitable material is one selected from the group of materials consisting of silicone elastomers and fluorocarbons.

Disposed on, and in electrical contact with, the contact 78 is an electrical contact assembly 128. The contact assembly 128 comprises a first electrical contact 130, a second electrical contact 132 and a third electrical contact 134.

The first electrical contact 130 comprises an electrically and thermally conductive material such, for example, as copper. Anticipated electrical contact surfaces of the contact 130 may be coated with a suitable metal, such for example, as silver or gold, to provide less corrosive contact surfaces.

The second electrical contact 132 comprises an electrically and thermally conductive material. A suitable material is one selected from the group consisting of molybdenum, tungsten, tantalum and combinations and base alloys thereof. The contact 132 is joined to the contact 130 by suitable means known to those skilled in the art, such, for example, as brazing and soldering. A preferred method is to join the contacts 130 and 132 together with a layer 131 of a suitable semiconductor solder material such, for example, as a silver, or a gold, base solder. Such a silver, or a gold, base solder has a melting point above approximately 350° C. and is known to those skilled in the art as a "hard solder."

The contacts 130 and 132 may also be combined into an integral electrical contact by machining the desired shaped contact from a single piece of suitable material or by molding or sintering the required shaped contact.

The third electrical contact 134 is disposed upon the second electrical contact 132 by such suitable means as electrodeposition and by affixing a preformed disk to the contact 132 and contouring the disk to shape to form the contact 134. The preferred means is to employ a layer 138 of solder to join the contact 134 to the contact 132.

The solder layer 138 preferably comprises a silver, or a gold, base solder having a melting point above approximately 350° C. and known to those skilled in the art as a "hard solder."

The third electrical contact 134 comprises a non-reactive malleable material approximately 0.005 inch in thickness. The contact 134 compensates for any surface irregularities which may occur between the contact assembly 128 and the contact 78. The material comprising the contact 134 is a metal selected from the group consisting of gold, tin, silver and aluminum. A preferred material is silver.

The contact assembly 128 is disposed on the contact 78 in a manner which projects the assembly 128 through the aperture 98 of the contact washer 92.

To assure the electrical integrity of the electrical contact assembly 128, a layer 140 of an electrically insulating material may be disposed about the outer periphery of the contact assembly 128. The layer 140 increases the reliability of the device 110 by preventing any premature failing from occurring due to an electrical short circuit occurring between the contact assembly 128 and the contact washer 92.

A moisture getter 142 is disposed about, and on, portions of the contact assembly 128 between the contact 130 and the contact washer 92. To enable the material comprising the getter 142 to operate efficiently, one or more through apertures may be formed in the washer 92, preferably between the ridge 96 and the ridge 120.

A second soft, pliable annular gasket 144 is disposed in the trough 124 of the contact washer 92. The inner periphery of the gasket 144 conforms to the outer periphery of the contact 130, whereby the contact assembly 128 is centered on the contact 78. The cooperation of the gasket 144 with the trough 124 eliminates the necessity for physically bonding the contact assembly 128 to the contact 78.

The gasket 144 must be capable of retaining its physical and chemical properties for any temperature operating conditions of the device 110. Suitable materials for temperatures up to 260° C. are silicone elastomers and fluorocarbons.

A metal membrane 146 is disposed on, and in electrical and thermal contact with, the contact assembly 128 and the second gasket 144. The membrane 146 is exactly the same as the membrane 100.

The membrane 146 has a raised boss 148 having an upper surface 150. The surface 150 is in electrical and thermal contact with the contact assembly 128. An annular trough 152 encompasses the boss 148. A raised projection 154 encompasses the trough 152 and extends above the surface 150.

The membrane 146 is a malleable, nonmagnetic, noble material. The membrane 146 has good thermal and electrical conductivity properties. The membrane 146 comprises a metal selected from the group consisting of tin plated copper, silver, aluminum and tin.

The trough 152 cooperates with the second gasket 144 to center the membrane 146 on the contact assembly 128.

To provide an electrical connection means to the contact 84, a tab 156 is attached to the contact washer 92. The tab 156 may be a separate detail or it may be an integral part of the contact washer 92. A through hole may be provided in the tab 156 in order to facilitate the joining of an electrical lead to the tab 156. To further enhance its joining to an electrical lead, the tab 156 may be tin plated.

All the components hereinbefore described and now disposed between the two membranes 100 and 146 are placed in a mold. The membranes 100 and 146 are urged together by compressing the components in the mold. By forcing the membranes 100 and 146 together, the gasket 126 is compressed within the trough 116 of the membrane 100 by the bottom of the trough 124 of the contact washer 92. Simultaneously, the gasket 144 is compressed within the trough 152 of the membrane 146 and the trough 124 of the contact washer 92. This compressing action hermetically seals the element 62 within the membranes 100 and 146 while forcibly maintaining the contact assembly 128 as well as the membrane 100 and the contact 88 and the membrane 146 and the contact 130 and the contact 78 of the element 62 in a good electrical and thermal conductivity relationship.

The components are retained by force within the mold while a suitable encapsulating material is deposited and rammed about the outer periphery of the membranes 100 and 146, the gaskets 126 and 144 and the contact washer 92. A preferred material is a granulated thermosetting plastic.

Molding of the plastic is accomplished by conventional means known to those skilled in the art. A pressure of from 200 to 2000 pounds per square inch (p.s.i.) is applied to the plastic while the plastic and the components are heated to about 150° C. to 200° C. Heat and pressure is maintained for about 2 to 4 minutes. The preferred conditions are a pressure of 1000 p.s.i. at a temperature of 180° C. for approximately 3 minutes. Upon setting, the plastic produces an excellent mechanical seal and rigid retaining encapsulating structure 158 for the device 110, thus insuring a hermetic seal being retained between the gaskets 126 and 144 and the respective membranes 100 and 146 and the contact washer 92.

The following example is illustrative of the teachings of this invention:

A body of N-type silicon, having two major opposed surfaces substantially parallel to each other, was prepared by suitable means known to those skilled in the art. The wafer was then suitably doped, by means also known to those skilled in the art, with a P-type dopant to create a P-N-P semiconductor element, the layers of conductivity being substantially parallel to each other.

One major surface of the semiconductor element was joined to an electrical contact comprising a disk of molybdenum by an alloy fusion method. Aluminum comprised the essential material of the alloy fusion material. Peripheral surfaces of the element where semiconductor transition regions were exposed were coated with a room temperature vulcanizing silicone polymer.

Two contacts were formed on the other major surface of the element. One contact comprised a circular disk disposed on the central area of the major surface. An alloy of gold-antimony was employed to form a rectifying junction, or emitter, with the layer of P-type semiconductivity by means of an alloy technique well known to those skilled in the art. The second electrical contact was a continuous annular ring disposed about, and separate from the first electrical contact. An alloy of gold-boron was employed to make the non-rectifying electrical contact which was formed by the alloy technique.

The element, with its alloyed electrical contacts was then secured in a self-aligning cup of an apparatus assembly jig. An embossed, apertured silver contact washer, having the shape of the contact washer and the integral electrical tab shown in FIG. 3, was then disposed on the element and suitably fixtured within the jig. The ridge of the washer immediately adjacent to the aperture of the washer was positioned so that it contacted the surface of the annular contact of the element. The washer had an integral tab to which an electrical lead was to be attached later. The tab assisted in positioning the washer in the jig.

Since the annular ring measured slightly less than 1.4 linear inches, a force of 200 pounds was applied to urge the washer into a better contact with the element. Keeping this force constant, the jigged components were placed in a furnace and kept at an elevated temperature of 250° C.±10° C. for 3 hours, whereby the washer was solid state bonded to the contact of the element. The jigged components were then removed from the furnace and the bonded components removed from the jig.

A contact assembly was made by bonding together a copper disk, a molybdenum disk and a silver disk with alloys of a hard solder disposed between, and joining together, each two adjacent disks.

The surface of the copper disk not joined to the molybdenum disk was plated with silver to provide a less corrosive contact surface. The outer peripheral surface of the silver and molybdenum disks were coated with a room temperature vulcanizing silicone polymer.

Two silver membranes were formed into a configuration shown for the membranes 100 and 146 of FIG. 3. An annular silicone rubber O-ring was disposed in the trough about the raised embossment of one of the members. The assembly comprising the silver washer, bonded to the contact, was then placed on top of the membrane. The inner periphery of the O-ring conformed to the outer periphery of the contact joined to the element and centered the assembly on the membrane.

A second silicone rubber O-ring was then disposed in the trough of the washer. An apertured moisture getter device was disposed on the washer. The contact assembly was then disposed on the central contact of the element, the assembly projecting upward through the apertures of the silver washer, and the moisture getter device. The silver disk was in contact with the element's contact and the silver plated copper disk was furthest from the element. The O-ring cooperating with the trough of the washer centered the contact assembly of the contact of the element.

The second silver membrane was then disposed on the second silicone O-ring and the silver plated copper disk of the contact assembly. The O-ring's inner periphery coincided with the outer periphery of the copper disk and centered the contact assembly with respect to the raised embossment of the membrane.

The assembled components were then disposed in a mold jig assembly. The components were compressed together while a granulated thermosetting plastic was rammed about the outer periphery of the assembled components. The plastic was then subjected to 1000 p.s.i. pressure and a temperature of 180° C. for a period of approximately 3 minutes.

Heat and pressure were removed from the assembled components. The encapsulated electrical device was then electrically tested. All electrical results obtained were equal to or better than the calculated figures determined from the preliminary design before the components were assembled together.

The device was then subjected to electrical tests under various environmental conditions. Results showed the semiconductor element to be hermetically sealed within the device.

The plastic encapsulation was then broken and the device disassembled. The silver washer contact was then forced to separate from the annular contact of the element. Severe distortion of the washer occurred and portions of the semiconductor material from the element were removed with the contact by the washer contact.

While the invention has been described with reference to particular embodiments and examples, it will be understood, of course, that modifications, substitutions, and the like may be made herein without departing from its scope.

We claim as our invention:

1. An electrical device comprising (1) a first electrically and thermally conductive membrane, (2) a second electrically and thermally conductive membrane, (3) a semiconductor element having at least three regions of semiconductivity disposed between the two membranes, one region of semiconductivity being in an electrical and thermal conductive relationship with the first membrane and a second region of semiconductivity being in an electrical and thermal conductive relationship with the second membrane, (4) an electrical contact means disposed between the two membranes and connected to at least a portion of a third region of semiconductivity of the element, (5) hermetic sealing means cooperating with the two membranes and the electrical contact means to hermetically seal the semiconductor element within the device, said hermetic sealing means consisting of a resilient member of electrically insulating material disposed between a portion of each membrane and the electrical contact means connected to the third region of semiconductivity of the semiconductor element and an electrically insulating encapsulating material disposed about, and between, outer peripheral portions of the hermetic sealing means, and (6) means for connecting the electrical contact means into an electrical circuit external to the device.

2. The electrical device of claim 1 in which the electrical contact means connected to the third region of conductivity of the semiconductor element comprises an embossed washer comprising a material selected from the group consisting of silver, copper, tin, aluminum, and base alloys thereof.

3. The electrical device of claim 1 in which at least one electrically nonconducting moisture getter is disposed between one of the membranes and the electrical contact means to the third region of semiconductivity of the semiconductor element.

4. The electrical device of claim 1 in which each membrane comprises a metal selected from the group consisting of tin, copper, silver and base alloys thereof.

5. The electrical device of claim 1 in which the resilient member comprises a material selected from the group consisting of silicone elastomers and fluorocarbons.

6. The electrical device of claim 2 in which the electrical contact means is affixed to the third region of semiconductivity of the semiconductor element by a means selected from the group consisting of solid state bonding and ultrasonic welding.

7. The electrical device of claim 2 in which the electrical contact means connected to the third region of semiconductivity of the semiconductor element and the metal membranes each contain trough-like depressions for orienting resilient components of the hermetic sealing means disposed therein between each membrane and the electrical contact means to the third region.

8. The electrical device of claim 2 in which the resilient members are preferentially oriented by the structure configuration of each membrane and the electrical contact means, the resilient members in turn preferentially orienting the semiconductor element and any electrical contact means electrically and thermally connecting each respective region of conductivity to its respective membrane.

References Cited

UNITED STATES PATENTS

| | | | |
|---|---|---|---|
| 2,490,435 | 12/1949 | Hedding | 317—234 |
| 2,876,401 | 3/1959 | Fuller | 317—234 |
| 2,946,935 | 7/1960 | Finn | 317—234 |
| 3,222,579 | 12/1965 | Fitzgibbon et al. | 317—234 |
| 3,225,416 | 12/1965 | Diebold | 317—234 |
| 3,310,716 | 3/1967 | Emeis | 317—234 |

FOREIGN PATENTS

| | | |
|---|---|---|
| 926,423 | 5/1963 | Great Britain. |
| 1,367,745 | 6/1964 | France. |

JOHN W. HUCKERT, *Primary Examiner.*

R. F. POLISSACK, *Assistant Examiner.*

U.S. Cl. X.R.

317—235